United States Patent
Sakamoto et al.

(10) Patent No.: US 6,531,370 B2
(45) Date of Patent: Mar. 11, 2003

(54) METHOD FOR MANUFACTURING CIRCUIT DEVICES

(75) Inventors: Noriaki Sakamoto, Gunma (JP); Yoshiyuki Kobayashi, Gunma (JP); Junji Sakamoto, Gunma (JP); Yukio Okada, Gunma (JP); Yusuke Igarashi, Gunma (JP); Eiju Maehara, Gunma (JP); Kouji Takahashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/944,322

(22) Filed: Aug. 31, 2001

(65) Prior Publication Data

US 2002/0028525 A1 Mar. 7, 2002

(30) Foreign Application Priority Data

| Sep. 4, 2000 | (JP) | 2000-266736 |
| Sep. 4, 2000 | (JP) | 2000-266751 |
| Sep. 4, 2000 | (JP) | 2000-266752 |

(51) Int. Cl.[7] .................................................. H01L 21/331
(52) U.S. Cl. .................................................................. 438/343
(58) Field of Search .............................. 428/343; 438/113; 174/259; 257/79, 690, 768

(56) References Cited

U.S. PATENT DOCUMENTS 6,121,553 A * 9/2000 Shinada ..................... 174/259
6,180,435 B1 * 1/2001 Ise ............................ 438/113
6,303,219 B1 * 10/2001 Sawamura ................ 428/343

* cited by examiner

Primary Examiner—John F. Niebling
Assistant Examiner—André C Stevenson
(74) Attorney, Agent, or Firm—Fish & Richardson P.C.

(57) ABSTRACT

After mounting portions (65) are formed in each block (62), circuit elements are mounted on the mounting portions (65) and molded with insulating resin (50). Then, the back surface of conductive foil (60) is etched to form conductive patterns 51in each block. Further, a plurality of blocks are bonded onto a adhesive sheet so that a testing step and a dicing step are carried out upon the blocks in a lump.

32 Claims, 13 Drawing Sheets

METHOD FOR MANUFACTURING CIRCUIT DEVICES

BACKGROUND OF THE INVENTION

The present invention relates to a method for manufacturing circuit devices, and particularly relates to a method for manufacturing low-profile circuit devices that does not require any supporting substrate.

Circuit devices set in electronic equipment are heretofore desired to be made smaller in size, thinner in thickness and lighter in weight because they are used in portable telephones, portable computers, etc.

For example, a semiconductor device will be described as such a circuit device by way of example. As a typical semiconductor device, there is conventionally a packaged semiconductor device sealed by usual transfer molding. This semiconductor device is mounted on a printed circuit board PS as shown in FIG. 12.

In the packaged semiconductor device, a semiconductor chip 2 is covered with a resin layer 3, and lead terminals 4 for external connection are led out from side portions of the resin layer 3.

Because the lead terminals 4 are led from the resin layer 3 to the outside, the whole size of the packaged semiconductor device 1 is, however, too large to satisfy the request to make it smaller in size, thinner in thickness and lighter in weight.

Therefore, various structures have been developed by various manufacturers in order to make packaged semiconductor devices smaller in size, thinner in thickness and lighter in weight. Recently, the packaged semiconductor devices are developed into Chip Size Packages (CSPs) such as wafer-scale CSPs as large as the chip size, or CSPs a little larger than the chip size.

FIG. 13 shows a CSP 6 which uses a glass epoxy substrate 5 as a supporting substrate and which is a little larger than the chip size. Here, description will be made on the assumption that a transistor chip T has been mounted on the glass epoxy substrate 5.

A first electrode 7, a second electrode 8 and a die pad 9 are formed on the front surface of the glass epoxy substrate 5 while a first back-surface electrode 10 and a second back-surface electrode 11 are formed on the back surface of the glass epoxy substrate 5. The first and second electrodes 7 and 8 are electrically connected to the first and second back-surface electrodes 10 and 11 via through holes TH respectively. In addition, the bare transistor chip T is firmly fixed to the die pad 9. An emitter electrode of the transistor is connected to the first electrode 7 through a metal fine wire 12, and a base electrode of the transistor is connected to the second electrode 8 through a metal fine wire 12. Further, a resin layer 13 is provided on the glass epoxy substrate 5 so as to cover the transistor chip T.

The CSP 6 uses the glass epoxy substrate 5 to thereby achieve a simple structure extending from the chip T to the back-surface electrodes 10 and 11 for external connection, compared with a wafer-scale CSP. Thus, there is a merit that the CSP 6 can be manufactured inexpensively.

In addition, the CSP 6 is mounted on a printed circuit board PS as shown in FIG. 12. Electrodes and wiring for constituting an electric circuit are provided on the printed circuit board PS, and the CSP 6, the packaged semiconductor device 1, a chip resistor CR or a chip capacitor CC, etc. are electrically connected and firmly fixed to the printed circuit broad PS.

Then, the circuit constituted on the printed circuit board will be attached to various sets.

Next, a method for manufacturing the CSP will be described with reference to FIGS. 14A to 14D and FIG. 15.

First, the glass epoxy substrate 5 is prepared as a base material (as a supporting substrate), and Cu foils 20 and 21 are bonded to both sides of the glass epoxy substrate 5 through an insulating bonding material respectively (the above step is illustrated in FIG. 14A).

Subsequently, the Cu foils 20 and 21 corresponding to the first electrode 7, the second electrode 8, the die pad 9, the first back-surface electrode 10 and the second back-surface electrode 11 are covered with an etching-proof resist 22 and patterned. Incidentally, the front surface and the back surface of the glass epoxy substrate 5 may be patterned separately (the above step is illustrated in FIG. 14B).

Subsequently, holes for the through holes TH are formed in the glass epoxy substrate by use of a drill or a laser, and then plated. Thus, the through holes TH are formed. Via the through holes TH, the first and second electrodes 7 and 8 are electrically connected to the first and second back-surface electrodes 10 and 11 respectively (the above step is illustrated in FIG. 14C).

Further, though not shown, the first and second electrodes 7 and 8 which will be bonding posts are plated with Ni, while the die pad 9 which will be a die bonding post is plated with Au. Then, the transistor chip T is die-bonded.

Finally, the emitter electrode and the base electrode of the transistor chip T are connected to the first and second electrodes 7 and 8 through the metal fine wires 12 respectively, and covered with the resin layer 13 (the above step is illustrated in FIG. 14D).

In the above-mentioned manufacturing method, a CSP type electric element using the supporting substrate 5 is produced. Alternatively, in this manufacturing method, the glass epoxy substrate 5 may be replaced by a flexible plate as a supporting substrate to produce the CSP type electric element similarly.

On the other hand, a manufacturing method useing a ceramic substrate is shown in the flow chart of FIG. 15. A ceramic substrate which is a supporting substrate is prepared, and through holes are formed therein. After that, front-surface and back-surface electrodes are printed with conductive paste, and sintered. The following steps up to covering with a resin layer are the same as those in the manufacturing method in FIG. 14. However, differently from the flexible sheet or the glass epoxy substrate, the ceramic substrate is very fragile to be chipped easily. Therefore, there is a problem that the ceramic substrate cannot be molded by use of a mold. Thus, the CSP type electric element is produced by potting sealing resin on the ceramic substrate, hardening the sealing resin, polishing the sealing resin to be even, and finally separating the ceramic substrate with the sealing resin individually by use of a dicing apparatus. Also in the case where the glass epoxy substrate is used, there is a fear that the substrate is crushed when it is strongly held by a molding mold for transfer molding.

In FIG. 13, the transistor chip T, the connection member 7 to 12, and the resin layer 13 are essential constituent elements for electric connection with the outside and protection of the transistor. However, it is difficult to provide a circuit element made smaller in size, thinner in thickness and lighter in weight, by using all of such essential elements.

In addition, the glass epoxy substrate 5 which is a supporting substrate is unnecessary by nature as described above. However, in the manufacturing method, the glass epoxy substrate 5 cannot be omitted because the glass epoxy substrate 5 is used as a supporting substrate for bonding electrodes to each other.

Because the glass epoxy substrate 5 is used, the cost increases. Further, because the glass epoxy substrate 5 is thick, the circuit element becomes thick. Accordingly, there is a limit in making the circuit element smaller in size, thinner in thickness and lighter in weight.

Further, the step of forming the through holes for connecting the front-surface and back-surface electrodes to each other is indispensable to the glass epoxy substrate or the ceramic substrate. Thus, there is a problem that the manufacturing process is prolonged to be unfitted for mass production. In addition, the glass epoxy substrate has a scattering in thickness. On the other hand, the ceramic substrate is broken easily. Thus, pressure may crush the substrate if the pressure is applied thereto. There is therefore a problem that transfer molding cannot be carried out and sealing of the substrate must be attained by inefficient resin potting.

Furthermore, there is a problem that a method for manufacturing such compact circuit devices which are not separated individually until the final step is performed is not established yet.

SUMMARY OF THE INVENTION

In order to solve the above problems, according to the present invention, there is provided a method for manufacturing circuit devices, comprising the steps of: forming conductive patterns for each of blocks, the conductive patterns forming a large number of circuit element mounting portions on conductive foil; disposing circuit elements on the mounting elements of the conductive patterns in each of the blocks; commonly molding the circuit elements on the mounting portions with insulating resin to thereby cover the circuit elements with the insulating resin in a lump in each of the blocks; separating the blocks from the conductive foil, and bonding a plurality of the blocks onto a adhesive sheet so as to bring the insulating resin into contact with the adhesive sheet; testing quality of the circuit elements on the mounting portions in the blocks in a state in which the blocks are bonded to the adhesive sheet; and separating the insulating resin of the blocks for each of the mounting portions by dicing while the blocks are bonded to the adhesive sheet.

According to the present invention, the conductive foil for forming the conductive patterns is a starting material. The conductive foil has a supporting function till the conductive foil is molded with the insulating resin. After the molding, the insulating resin has a supporting function. In such a manner, a separate supporting substrate can be omitted so that the conventional problems can be solved.

In addition, according to the present invention, working of molding, testing and dicing can be carried out in each of blocks in a state in which the blocks are bonded to the adhesive sheet. Thus, a large number of circuit devices can be mass-produced so that the conventional problems can be solved. In order to solve the above problems, according to the present invention, there is provided a method for manufacturing circuit devices, constituted by the steps of: preparing conductive foil and forming isolation trenches, which are shallower than a thickness of the conductive foil, in the conductive foil at least excluding conductive patterns for forming a large number of circuit element mounting portions so as to form the conductive patterns for each of blocks; firmly fixing circuit elements to desired ones of the mounting portions of the conductive patterns; electrically connecting electrodes of the circuit elements on the mounting portions to the desired ones of the conductive patterns so as to form connection member; commonly molding the circuit elements on the mounting portions with insulating resin so as to cover the circuit elements in a lump with the insulating resin for each of the blocks and to fill the isolation trenches with the insulating resin; removing thick portions of the conductive foil where the isolation trenches are not provided; separating the blocks from the conductive foil, and bonding a plurality of the blocks onto a adhesive sheet so as to bring the insulating resin into contact with the adhesive sheet; testing quality of the circuit elements on the mounting portions in the blocks in a state in which the blocks are bonded to the adhesive sheet; and separating the insulating resin of the blocks into the mounting portions by dicing while the blocks are bonded to the adhesive sheet.

According to the present invention, the conductive foil for forming the conductive patterns is a starting material. The conductive foil is provided with the conductive patterns defined by the isolation trenches. The conductive foil has a supporting function till the conductive film is molded with the insulating resin. After the molding, the insulating resin has a supporting function. In such a manner, a separate supporting substrate can be omitted so that the conventional problems can be solved.

In addition, according to the present invention, a residual portion of the conductive foil having a uniform thickness is held by a molding mold so that transfer molding can be carried out. Respective blocks are transfer-molded with strips of the conductive foil. The following steps of testing, dicing, and so on, can be carried out in the state where a plurality of blocks are bonded onto the adhesive sheet. Thus, a large number of circuit devices can be mass-produced so that the conventional problems can be solved.

Further, according to the present invention, when a back-surface conductive foil treatment is performed after the molding, the respective blocks are treated with strips of the conductive foils, and the following steps of testing, dicing, and so on, can be carried out in the state where the blocks are bonded onto the adhesive sheet. Thus, a large number of circuit devices can be mass-produced so that the conventional problems can be solved.

DETAILED DESCRIPTION OF THE PREFERRED EMBODIMENT

First, a method for manufacturing circuit devices according to the present invention will be described with reference to FIG. 1.

The method according to the present invention comprises the steps of: forming conductive patterns for each of blocks, the conductive patterns forming a large number of circuit element mounting portions on conductive foil; disposing circuit elements on the mounting elements of the conductive patterns in each of the blocks; commonly molding the circuit elements on the mounting portions with insulating resin to thereby cover said circuit elements with the insulating resin in a lump in each of the blocks; separating the blocks from the conductive foil and bonding a plurality of the blocks onto a adhesive sheet so as to bring the insulating resin into contact with the adhesive sheet; testing quality of the circuit elements on the mounting portions in the blocks in a state in which the blocks are bonded to the adhesive sheet; and separating the insulating resin of the blocks for each of the mounting portions by dicing while the blocks are bonded to the adhesive sheet.

Figure 1:
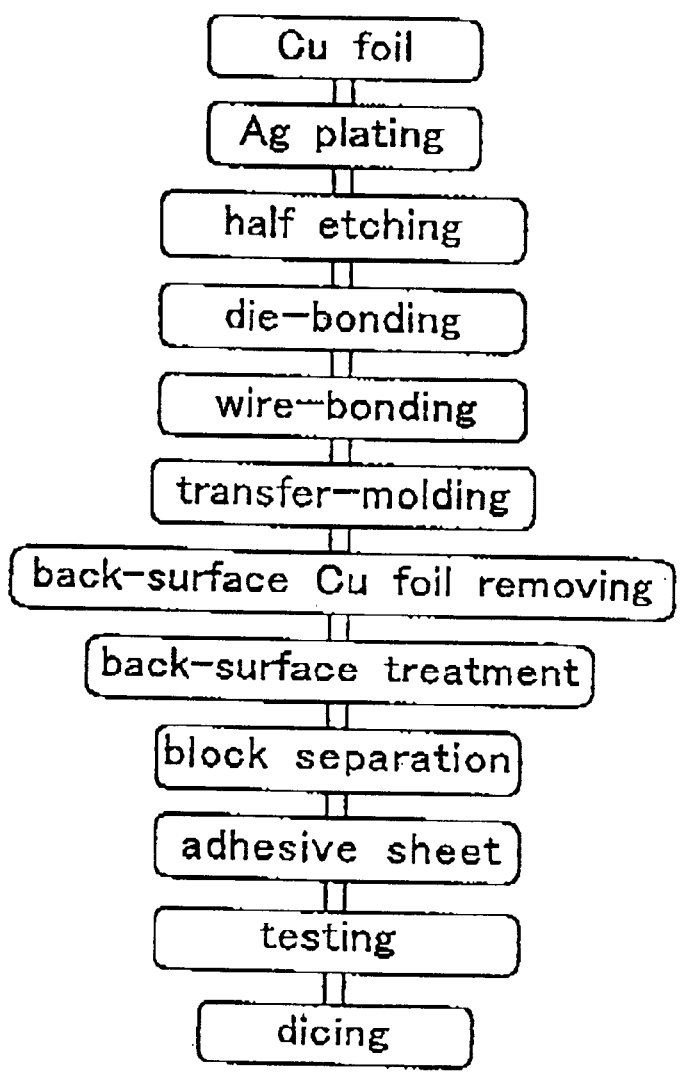
FIG. 1 is a diagram for explaining the flow of manufacturing according to the present invention.

Although the flow shown in FIG. 1 is not coincident with the above-mentioned steps, conductive patterns are formed by the three flow steps of Cu-foiling, Ag-plating and half-etching. In the two flow steps of die-bonding and wire-bonding, circuit elements are firmly fixed to respective mounting portions, and electrodes of the circuit elements are connected to the conductive patterns. In the flow step of transfer-molding, common molding is carried out with insulating resin. In the flow step of removing back-surface Cu foil, thick portions of conductive foil where no isolation trenches are provided are etched. In the flow step of back-surface treatment, electrodes of the conductive patterns exposed to the back surface are treated. In the flow step of block separation, respective blocks are mechanically separated from connection portions of the conductive foil. In the flow step of a adhesive sheet, a plurality of the blocks are bonded onto the adhesive sheet. In the flow step of testing, judgement whether the circuit elements mounted on the mounting portions are good products or not is made, or the quality of the circuit elements are rated. In the flow step of dicing, the insulating resin is diced so that the individual circuit elements are separated from one another.

The respective steps of a method for manufacturing circuit devices according to the present invention will be described below with reference to FIGS. 2A and 2B, FIG. 3, FIGS. 4A and 4B, FIG. 5, FIGS. 6A to 6C, FIGS. 7A and 7B, and FIGS. 8 to 11.

In the first step of the manufacturing method according to the present invention, conductive patterns 51 for forming a large number of mounting portions for circuit elements 52 are formed in conductive foil 60 in each block as shown in FIGS. 2A and 2B, FIG. 3 and FIGS. 4A and 4B. Specifically, conductive foil 60 is prepared, isolation trenches 61 shallower than the thickness of the conductive foil 60 are formed in the conductive foil 60 at least excluding the conductive patterns 51 for forming a large number of mounting portions for the circuit elements 52. Thus, the conductive patterns 51 are formed for each block.

Figure 2A:
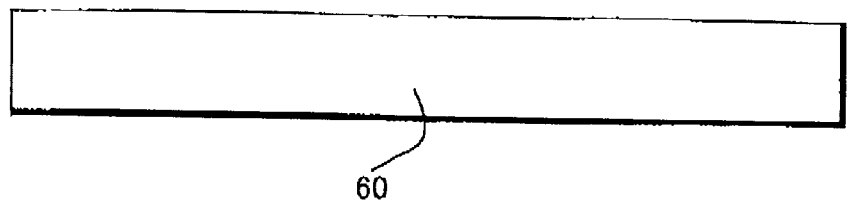
FIGS. 2A and 2B are diagrams for explaining a method for manufacturing circuit devices according to the present invention.

In this step, first, as shown in FIG. 2A, sheet-like conductive foil 60 is prepared. The material of this conductive foil 60 is selected taking in to account adhesion quality, bonding quality and plating quality of the soldering flux. As the material, conductive foil having Cu as its main material, conductive foil having Al as its main material, conductive foil made of an alloy of Fe—Ni or the like, and so on, may be used.

The thickness of the conductive foil preferably ranges from about 10 $\mu$m to about 300 $\mu$m in consideration of later etching. Here, copper foil 70 $\mu$m (2 ounces) thick is used. Fundamentally, however, the thickness of the conductive foil may be not smaller than 300 $\mu$m, or not larger than 10 $\mu$m. It will go well if the isolation trenches 61 can be formed to be shallower than the thickness of the conductive foil 60, as will be described later.

Incidentally, the sheet-like conductive foil 60 is prepared in the form of a roll wound with a predetermined width, for example, a width of 45 mm. The roll of the conductive foil 60 may be conveyed for the respective steps which will be described later. Alternatively, the conductive foil 60 may be prepared in the form of strips each cut in a predetermined dimension, and conveyed for the respective steps which will be described later.

Figure 2B:
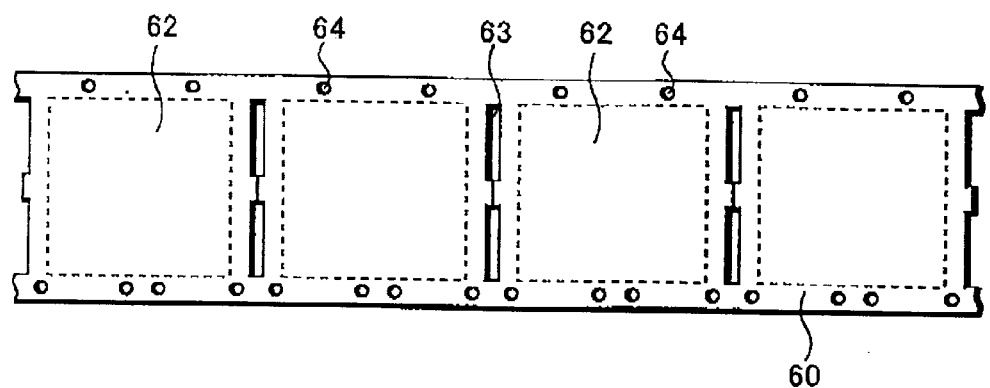

Specifically, as shown in FIG. 2B, four or five blocks in which a large number of mounting portions are formed in the strip-like conductive foil 60 are aligned at intervals. Slits 63 are provided between every adjacent two blocks 62 so as to absorb the stress of the conductive foil 60 generated by heat treatment in the molding step and so on. In addition, index holes 64 are provided at fixed intervals in the upper and lower circumferential ends of the conductive foil 60. The index holes 64 are used for positioning the conductive foil 60 in the respective steps.

Subsequently, conductive patterns 51 are formed in each block.

Figure 3:
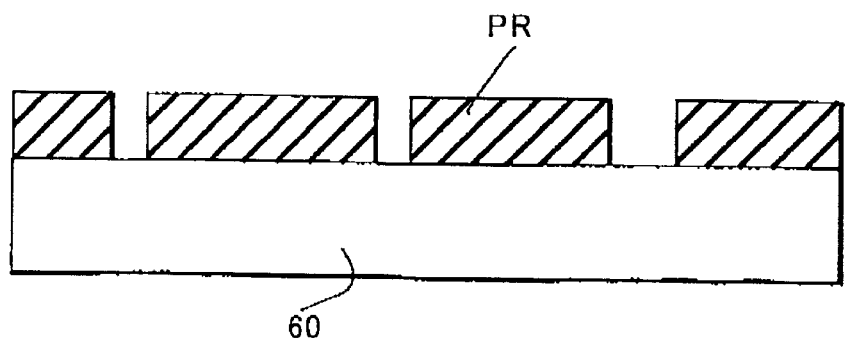
FIG. 3 is a diagram for explaining the method for manufacturing circuit devices according to the present invention.
Figure 4A:
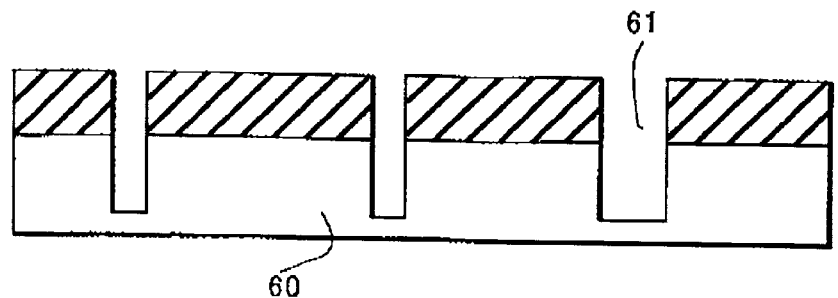
FIGS. 4A and 4B are diagrams for explaining the method for manufacturing circuit devices according to the present invention.

First, as shown in FIG. 3, a photo-resist (etching-proof mask) PR is formed on the Cu foil 60, and patterned to expose the conductive foil 60 except the areas which will become the conductive patterns 51. Then, as shown in FIG. 4A, the conductive foil 60 is etched selectively through the photo-resist PR.

The isolation trenches 61 formed by etching are, for example, 50 $\mu$m deep. The side surfaces of the isolation trenches 61 are formed so as to be roughened enough to enhance the adhesion quality of the isolation trenches to the insulating resin 50.

In addition, although the present invention has described the case where the side surfaces of the isolation trenches 61 are illustrated to be schematically straight, a structure of each side wall of the isolation trenches 61 may depend on a removing method. Wet-etching, dry-etching, evaporation by a laser, or dicing may be applied to the removing step. In the case of wet-etching, ferric chloride or cupric chloride is primarily used as etchant. The conductive foil is dipped into the etchant or showered with the etchant. Here, wet-etching is generally carried out as non-anisotropic etching. Thus, each side surface is formed to have a curved structure.

In the case of dry-etching, anisotropic or non-anisotropic etching can be carried out. At present, it is said that Cu cannot be removed by reactive ion etching, but Cu can be removed by sputtering. In addition, anisotropic or non-anisotropic etching can be carried out in accordance with the conditions of sputtering. Naturally, if anisotropic etching of Cu is established, further fine pattern of the Cu etching pattern can be realized.

In the case of a laser, the isolation trenches 61 can be formed by direct irradiation with laser. In this case, the side surfaces of the isolation trenches 61 are formed to be rather straight.

Incidentally, in FIG. 3, a conductive film (not shown) which is corrosive resistant to the etchant may be selectively applied in place of the photo-resist. If the conductive film is applied selectively to portions which will become conductive paths, the conductive film becomes an etching overcoat so that the isolation trenches can be etched without using any resist. Examples of the materials conceivable as the conductive film may include Ag, Ni, Au, Pt, Pd, etc. In addition, such corrosive resistant conductive films have a feature that they can be utilized as die pads or bonding pads as they are.

For example, an Ag film is bonded with Au, and also bonded with a soldering flux material. Thus, it the back surface of a chip is covered with an Au film, the chip can be thermo-compression-bonded directly to the Ag film on the conductive path 51, or the chip can be firmly fixed to the Ag film through a soldering flux material such as solder or the like. In addition, an Au fine wire can be bonded with the Ag conductive film so that wire-bonding can be carried out. Accordingly, there is a merit that such conductive films can be utilized directly as die pads or bonding pads.

In the conventional lead frame manufactured by punching or etching, changes of the pattern can not be quickly performed because of the step of changing punching mold. Turning to the present invention, since the isolation trenches 61 are formed by half-etching the conductive foil 60, arbitrary patterns can be formed by changing resists used as masks, therefore, fine and complicated pattern can be formed. This feature can eliminate the above drawbacks. Further, in the conventional lead frame, it is difficult to form a fine and long wiring because bowing occurs. According to the present invention, since patterns are formed by the half-etching, patterns are supported by the rest portion that is not half-etched in the conductive foil 60, thus realizing fine and long wirings. Therefore, a hybrid structure including semiconductor elements and passive elements can be packaged into 1 package in accordance with the figuration of the conductive pattern 51.

Figure 4B:
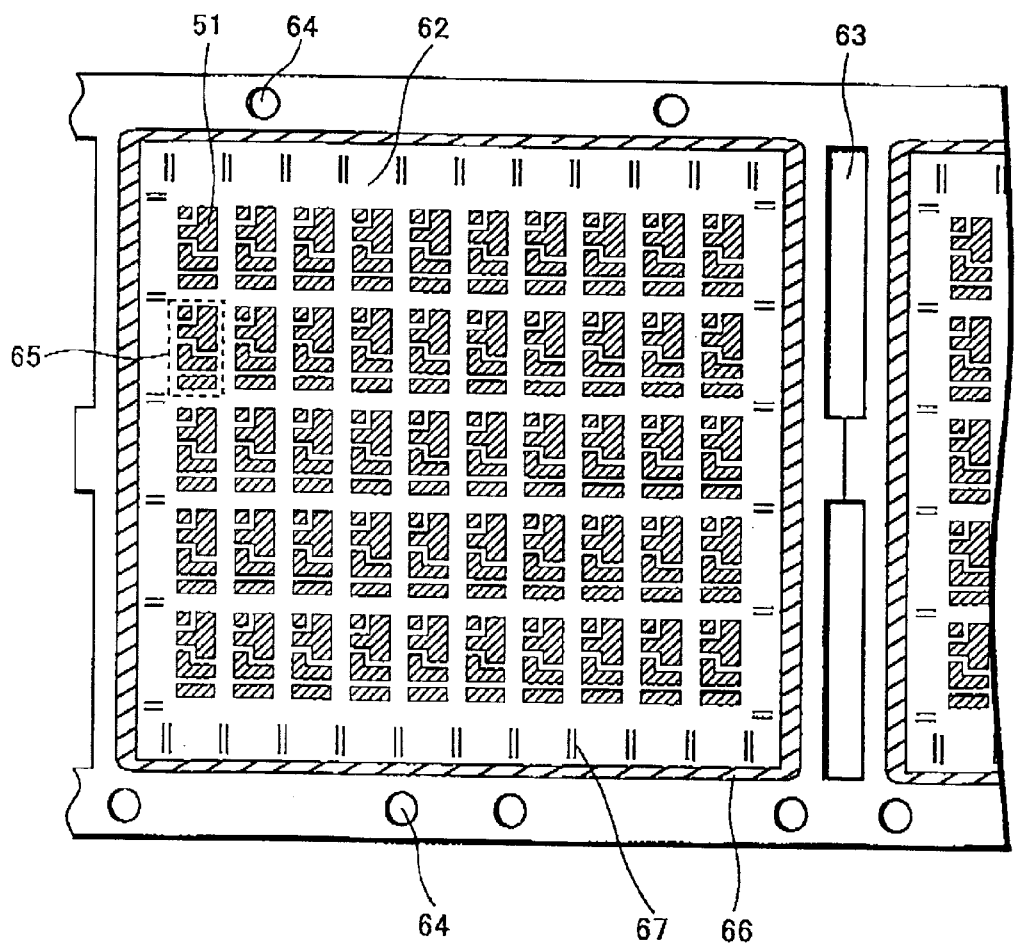

FIG. 4B shows specific conductive patterns 51. FIG. 4B corresponds to an enlarged one of the blocks 62 shown in FIG. 2B. Each black portion in FIG. 4B designates one mounting portion 65, constituting a conductive pattern 51. A large number of mounting portions 65 are aligned in a 5×10 matrix in each block 62. One and the same conductive pattern 51 is provided in each of the mounting portions 65. A frame-like pattern 66 is provided in the circumference of each block. Alignment marks 67 to be used in dicing are provided inside the frame-like pattern 66 and at a small distance therefrom. The frame-like pattern 66 is used to be fitted for a molding mold. The frame-like pattern 66 also has a function to reinforce the insulating resin 50 after the back surface of the conductive foil 60 is etched.

Figure 5:
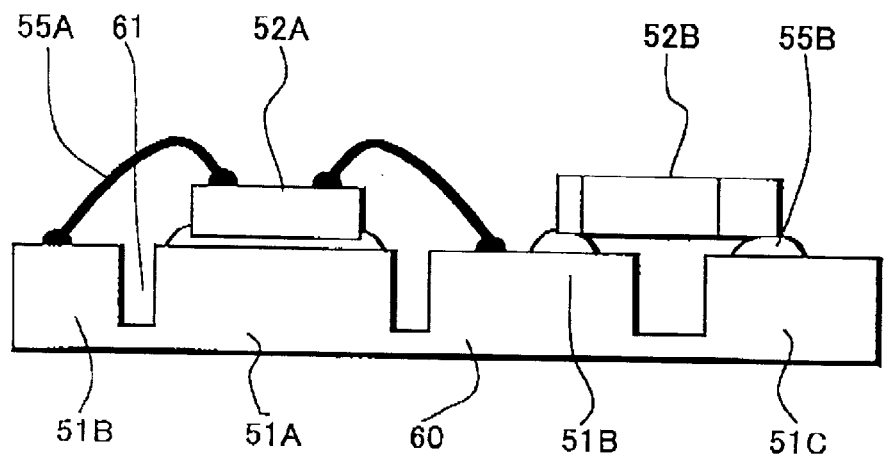
FIG. 5 is a diagram for explaining the method for manufacturing circuit devices according to the present invention.

In the second step of the present invention, as shown in FIG. 5, circuit elements 52 are disposed on the respective mounting portions 65 of the conductive patterns 51 in each block. Specifically, circuit elements 52 are firmly fixed to desired ones of the respective mounting portions 65 of the conductive patterns 51, and connection member are formed to electrically connect electrodes of the circuit elements 52 on the respective mounting portions 65 with the desired ones of the conductive patterns 51.

The circuit elements 52 may include semiconductor elements such as transistors, diodes, IC chips, etc., and passive elements such as chip capacitors, chip resistors, etc. In addition, facedown semiconductor elements such as CSPs, BGAs, etc., may be mounted though the thickness increases.

Here, a bare transistor chip 52A is die-bonded on a conductive pattern 51A, and the emitter electrode and the base electrode are connected to a conductive pattern 51B through metal fine wires 55A firmly fixed by thermo compression ball-bonding, ultrasonic wedge-bonding, or the like. In addition, a chip capacitor or a passive element 52B is firmly fixed to the conductive pattern 51B and a conductive pattern 51C through a soldering flux material such as solder or a conductive paste 55B.

Incidentally, if the circuit element 52A may be electrically insulated from the conductive pattern 51A, an insulating bonding material can be used in place of the conductive paste 55B. In such a case, the conductive pattern 51A may be used for another conductive path.

In this step, a large number of conductive patterns 51 are integrated in each block 62. Accordingly, there is an advantage that the circuit elements 52 can be firmly fixed and wire-bonded to the conductive patterns 51 extremely efficiently.

Figure 6A:
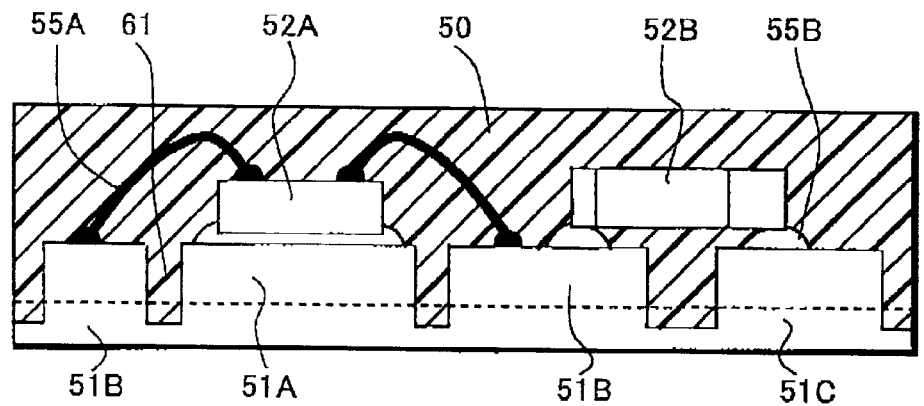
FIGS. 6A to 6C are diagrams for explaining the method for manufacturing circuit devices according to the present invention.
Figure 6B:
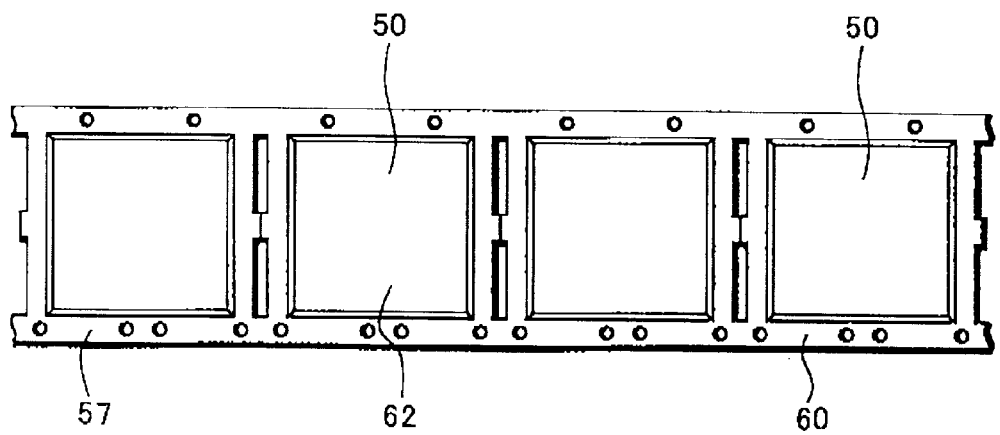
Figure 6C:
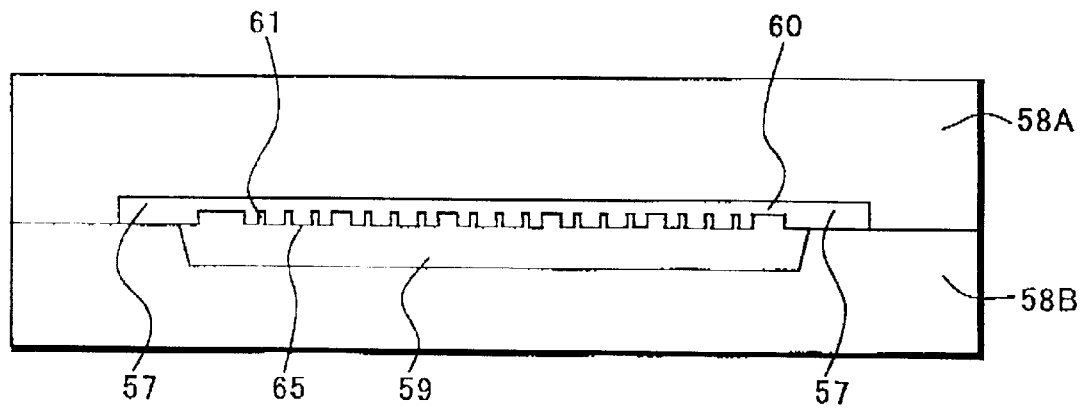

In the third step of the present invention, as shown in FIGS. 6A to 6C, the circuit elements 52 on the respective mounting portions 65 are commonly molded with the insulating resin 50 so as to be covered therewith in a lump in each block. Incidentally, the isolation trenches 61 are filled with the insulating resin 50 in this step.

In this step, as shown in FIG. 6A, the circuit elements 52A and 52B and a plurality of conductive patterns 51A to 51C are entirely covered with the insulating resin 50, and the isolation trenches 61 among the conductive patterns 51A to 51C are filled with the insulating resin 50. As a result, the insulating resin 50 is fitted for the curved structures of the side surfaces of the conductive patterns 51A to 51C so as to be firmly coupled therewith. Thus, the conductive patterns 51 are supported by the insulating resin 50.

In addition, this step can be carried out by transfer-molding, injection-molding, or dipping. As for resin materials, transfer-molding can be applied to thermosetting resin such as epoxy resin or the like, while injection-molding can be applied to thermoplastic resin such as polyimide resin, polyphenylene sulfide, or the like.

Further, when transfer-molding or injection molding is carried out in this step, the mounting portions 65 in each block 62 are received in a common molding mold, and commonly molded with one insulating resin 50 in each block, as shown in FIG. 6B. As a result, in comparison with a conventional method in which respective mounting portions are molded separately by transfer-molding or the like, the quantity of resin can be reduced on a large scale, and the molding mold can be used in common.

The thickness of the insulating resin 50 applied to the surface of the conductive foil 60 is adjusted to be about 100 $\mu$m deep from each of the top portions of the circuit elements 52 covered with the insulating resin 50. This thickness can be made thicker or thinner in consideration of strength.

Figure 12:
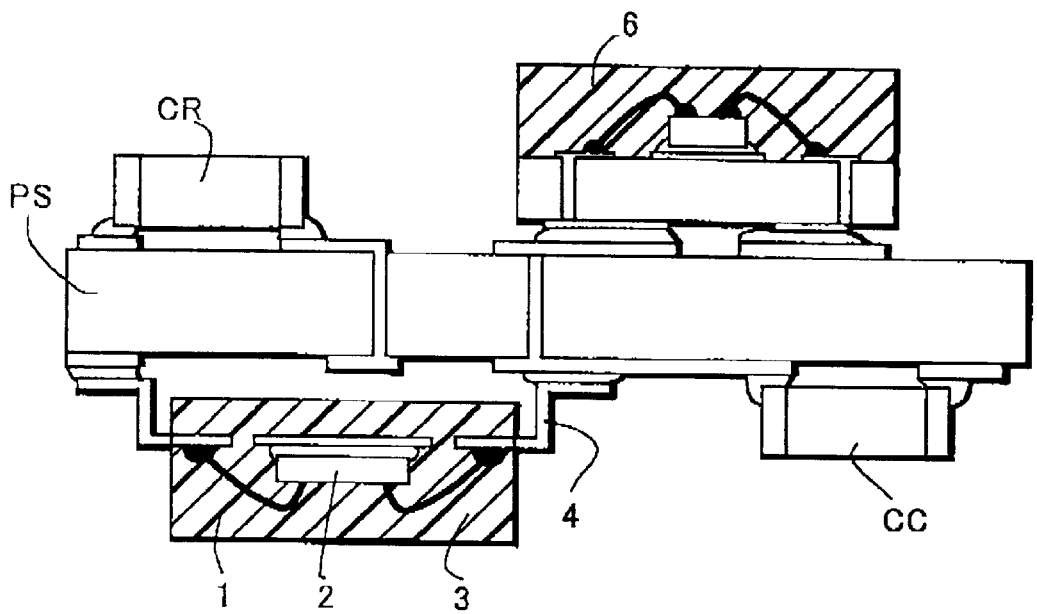
FIG. 12 is a diagram for explaining a conventional mounting structure for a circuit device.

This step has a feature that the conductive foil 60 forming the conductive patterns 51 functions as a supporting substrate till the insulating resin 50 is applied thereto. In the conventional case, the supporting substrate 5 which is not essentially required is used to form conductive paths 7 to 11 as shown in FIG. 12. In the present invention, however, the conductive foil 60 which forms a supporting substrate is a necessary material as an electrode material. Thus, there is am merit that working can be done while the construction material is saved to the utmost. Thus, the cost can be also reduced.

In addition, the isolation trenches 61 are formed to be shallower than the thickness of the conductive foil. Thus, the conductive foil 60 is not separated into conductive patterns 51 individually. Accordingly, the sheet-like conductive foil 60 can be handled as a united sheet. Thus, there is a feature that the working of conveying the conductive foil 60 to a mold and mounting it in the mold can be carried out very easily when the insulating resin 50 is to be molded.

Further, another mode will be described with reference to FIG. 6C. A residual portion 57 of the conductive foil 60 in the periphery of each block 62 is held between molds 58A and 58B, and the respective mounting portions 65 of the block 62 are disposed in one and the same cavity 59. This residual portion 57 is formed out of the conductive foil 60 made of metal, and removed in a following step. Therefore, there is no problem even if the residual portion 57 is held by solderless bonding between the molds 5A and 58B so as to be deformed. In addition, the respective mounting portions 65 in each block 62 are placed with the bottom up in the cavity 59, and the insulating resin 50 is transfer-molded so that the isolation trenches 61 are filled therewith.

Figure 7A:
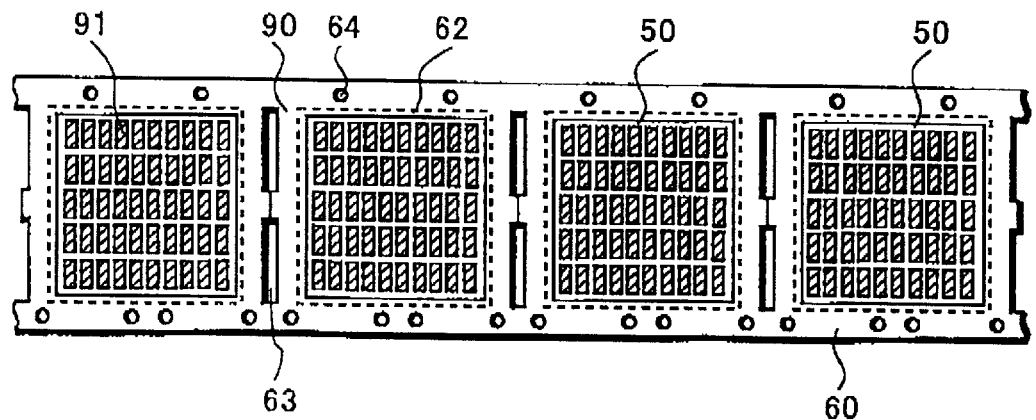
FIGS. 7A and 7B are diagrams for explaining the method for manufacturing circuit devices according to the present invention.
Figure 7B:
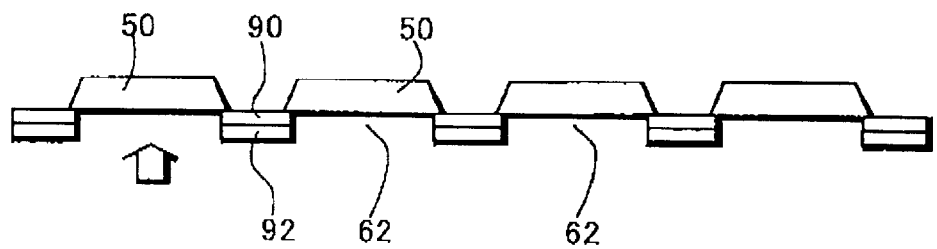

In the fourth step of the present invention, as shown in FIGS. 7A and 7B, thick portions of the conductive foil 60 where the isolation trenches 61 are not provided are removed. Specifically, the thick portions of the conductive foil 60 where the isolation trenches 61 are not provided, at least the areas where the conductive patterns 51 are provided in each block 62 are removed to selectively leave the conductive foil 60 which will become connection portions 90 (the same as the residual portion 57 in the previous step) for connecting one block 62 with another.

In this step, as shown in FIG. 7A, the back surface of the conductive foil 60 in each block 62 at least excluding areas 91 where the conductive patterns 51 are provided is covered to overlap the circumferential end portion of the insulating resin 50. After that, the exposed conductive foil 60 is showered with etchant, and the areas 91 where the conductive patterns 51 are provided are selectively wet-etched. Thus, the conductive patterns 51 are exposed.

FIG. 7B shows a section after the wet-etching is completed. The upper and lower circumferential ends of the conductive foil 60, and the portion of the conductive foil 60 where the slits 63 are provided in each block 62 are left as the connection portions 90 where the conductive foil 60 is not etched. The connection portions 90 have a function to keep the respective blocks 62 as they are. By the function of the connection portions 90, the respective blocks 62 can be extracted from an etching apparatus together with the connection portions 90.

Figure 13:
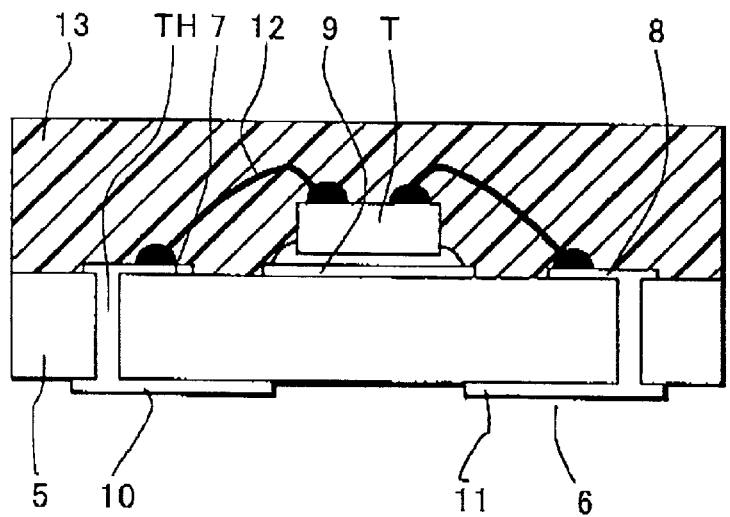
FIG. 13 is a diagram for explaining the conventional circuit device.
Figure 14A:
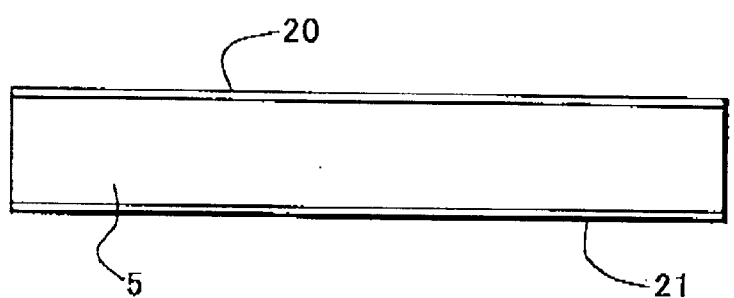
FIGS. 14A to 14D are diagrams for explaining a conventional method for manufacturing the circuit device.
Figure 14B:
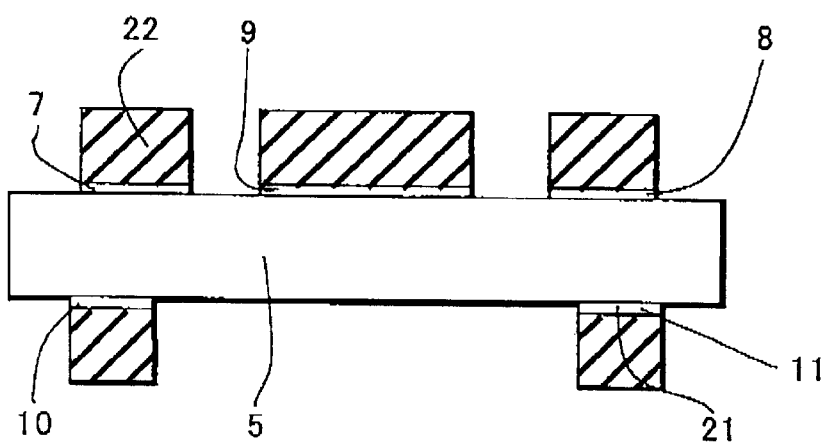
Figure 14C:
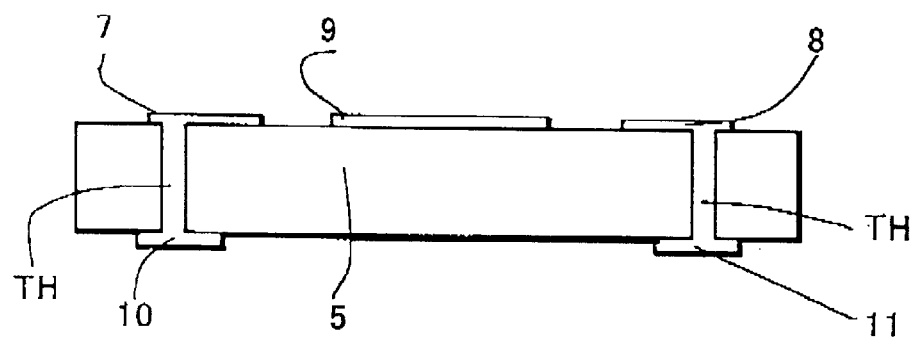
Figure 14D:
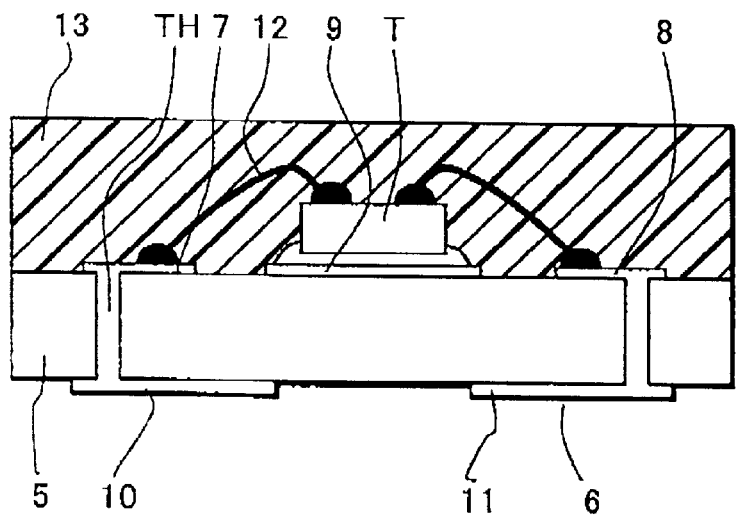
Figure 15:
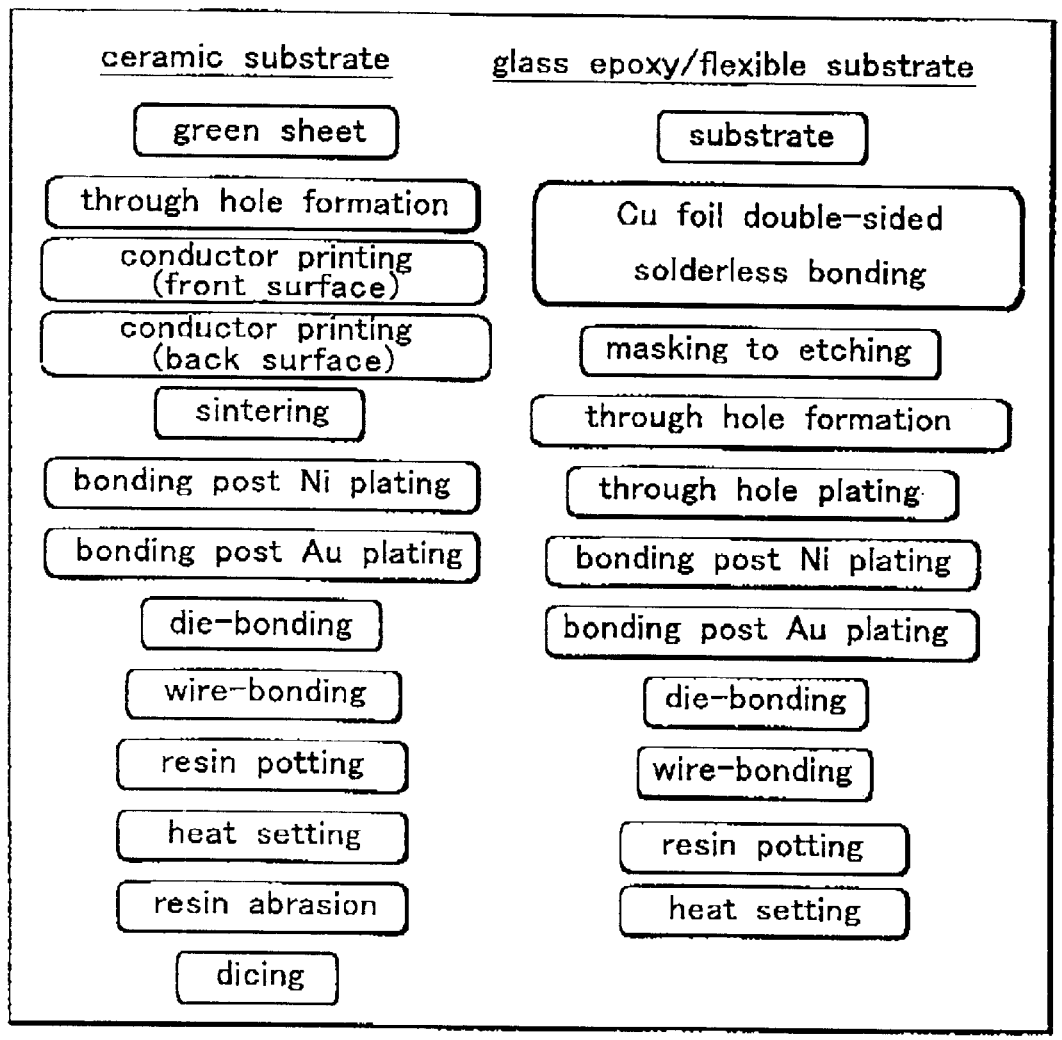
FIG. 15 is a diagram for explaining the conventional method for manufacturing circuit devices.

In this step, the conductive foil 60 in the area where the conductive patterns 51 are provided is wet-etched selectively immediately before the insulating resin 50 is exposed as shown by the dotted line in FIG. 6A. As a result, there is formed a structure in which the conductive patterns 51 about 40 μm thick are separated from one other, and the back surfaces of the conductive patterns 51 are exposed from the insulating resin 50. That is, there is formed a structure in which the surface of the insulating resin 50 charged into the isolation trenches 61 substantially coincides with the surfaces of the conductive patterns 51. Thus, no difference in level is provided in the circuit device 53 according to the present invention, differently from the conventional back-surface electrodes 10 and 11 shown in FIG. 13. Accordingly, when the circuit device 53 is mounted, the circuit device 53 has a feature that it can be moved horizontally as it is, by the surface tension of solder or the like. Thus, the circuit device 53 can be self-aligned.

Figure 8:
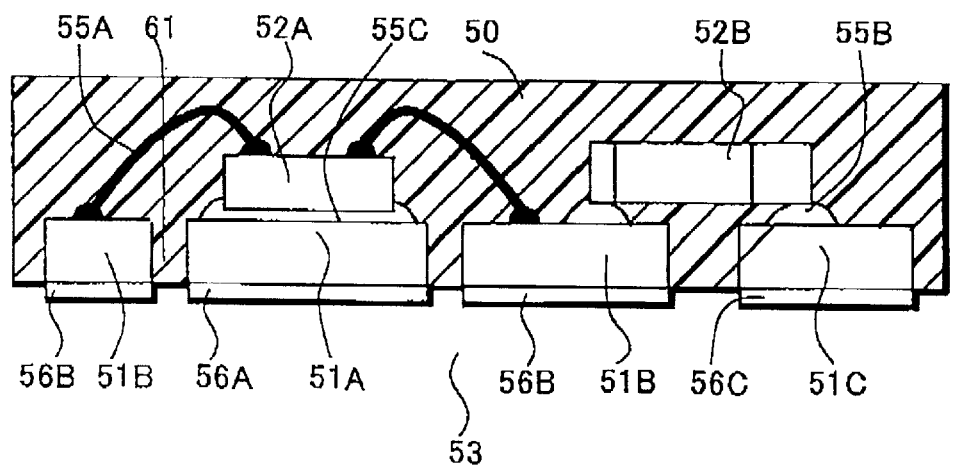
FIG. 8 is a diagram for explaining the method for manufacturing circuit devices according to the present invention.

Further, the back surfaces of the conductive patterns 51 are treated to obtain a final structure shown in FIG. 8. That is, the conductive patterns 51 exposed are covered with a conductive material such as solder or the like in accordance with necessity so that back-surface electrodes 56A to 56C are formed. Thus, a circuit device is completed.

In the fifth step of the present invention, as shown in FIG. 7B, the blocks 62 are separated from the connection portions 90 of the conductive foil 60.

In this step, the respective blocks 62 connected with each other through the connection portions 90 is pressed upwardly as shown by the arrow in FIG. 7B. Thus, the bonded surfaces between the connection portions 90 and the insulating resin 50 are peeled off mechanically so that the respective blocks 62 are separated. Therefore, there is an advantage that a special cutting mold is not required in this step, and working can be done in an extremely simple method.

Figure 9:
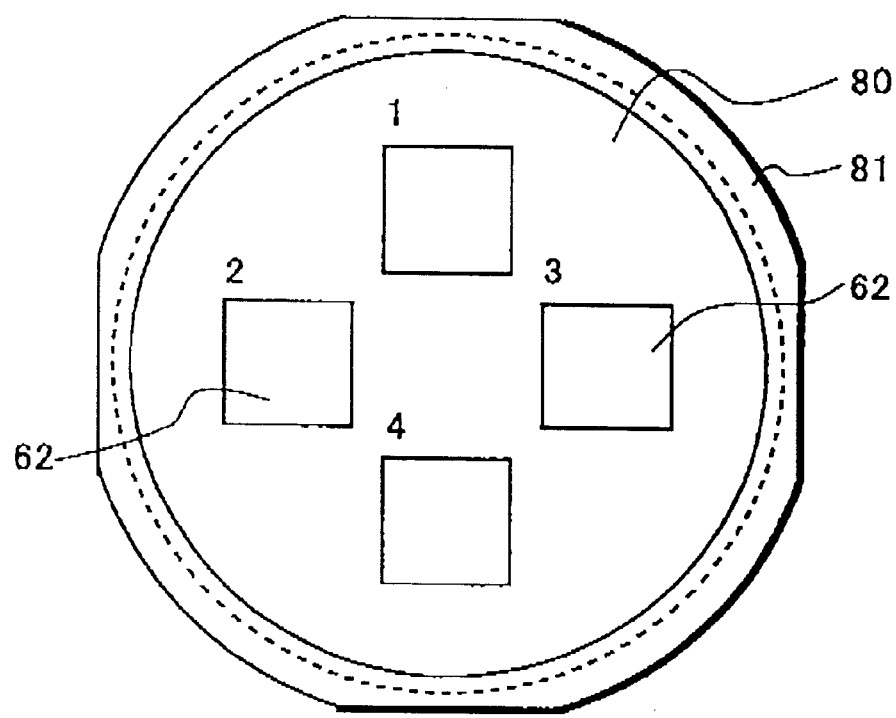
FIG. 9 is a diagram for explaining the method for manufacturing circuit devices according to the present invention.

In the sixth step of the present invention, as shown in FIG. 9, a plurality of the blocks 62 are bonded onto a adhesive sheet 80 so as to bring the insulating resin into contact with the adhesive sheet 80.

After the back surface of the conductive foil 60 has been etched in the previous step, the respective blocks 62 are separated from the conductive foil 60.

In this step, the circumference of the adhesive sheet 80 is bonded with a ring-like metal frame 81 made of stainless steel. Four blocks 62 are bonded with the center portion of the adhesive sheet 80 so as to bring the insulating resin 50 into contact with the adhesive sheet 80. Then, the four blocks 62 are bonded at intervals enough to prevent a blade from abutting against the blocks 62 at the time of dicing. A UV sheet (made by Lintec Corporation) is used as the adhesive sheet 80. However, a cheaper dicing sheet can be used because the respective blocks 62 have mechanical strength due to the insulating resin 50.

Figure 10:
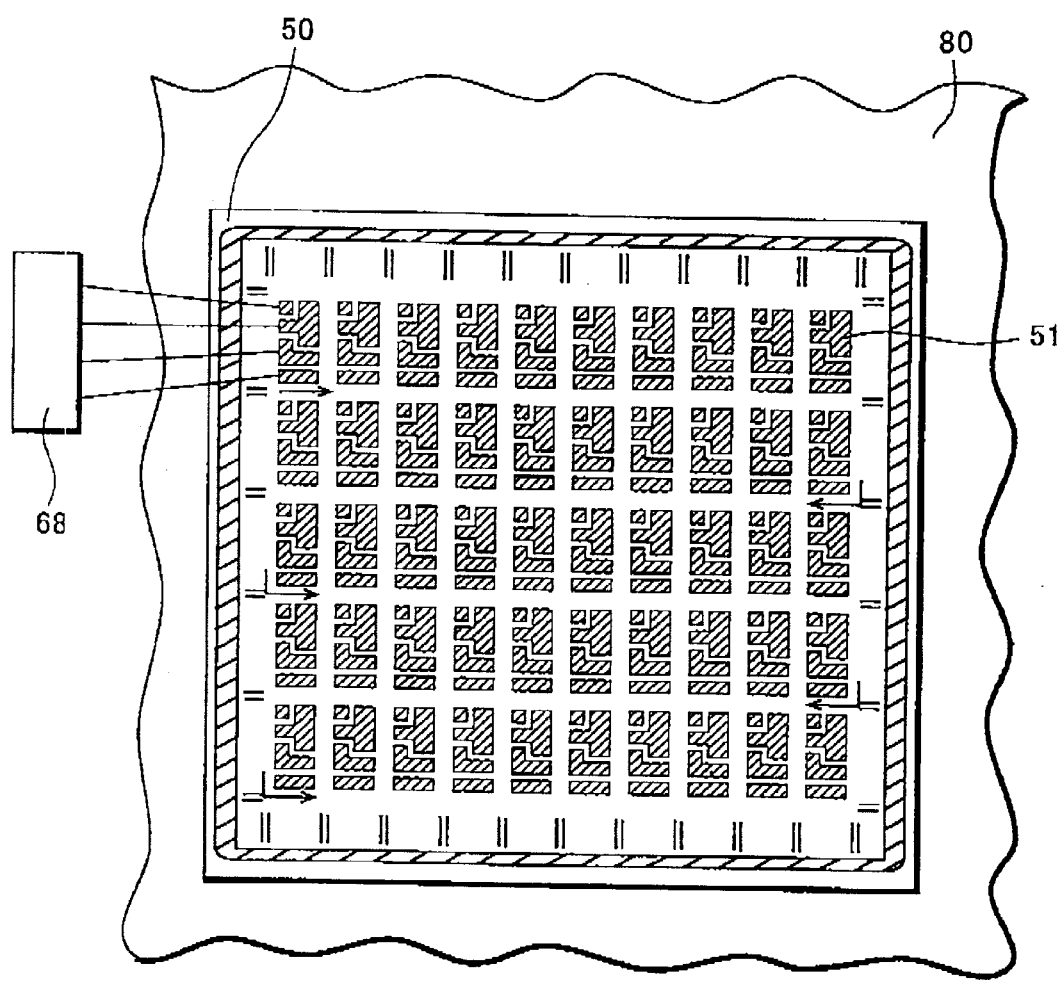
FIG. 10 is a diagram for explaining the method for manufacturing circuit devices according to the present invention.

In the seventh step of the present invention, as shown in FIG. 10, the quality of the circuit elements 52 on the respective mounting portions 65 in each block 62 molded in a lump with the insulating resin 50 are tested in the state where the block 62 is bonded with the adhesive sheet 80.

The back surfaces of the conductive patterns 51 are exposed in the back surface of each block 62 as shown in FIG. 10. The respective mounting portions 65 are aligned in a matrix precisely the same as the matrix used when the conductive patterns 51 are formed. Probes 68 are brought into contact with back-surface electrodes 56 of the conductive patterns 51 exposed from the insulating resin 50, so as to test the characteristic parameters of the circuit elements 52 on the respective mounting portions 65 individually. Thus, judgment as to whether products are defective or not is made, and defective products are marked in magnetic ink or the like.

In this step, the circuit devices 53 on the respective mounting portions 65 are supported integrally by the insulating resin 50 in each block 62, and therefore not separated individually. Accordingly, a plurality of the blocks 62 bonded with the adhesive sheet 80 are sucked onto a mounting table for a tester in vacuum. Each block 62 is fed and pitched vertically and horizontally correspondingly to the size of each mounting portion 65 as shown by the arrows in FIG. 10. Thus, the circuit devices 53 on the respective mounting portions 65 in each block 62 can be tested extremely quickly and in large quantities. That is, working required conventionally, for example, the judgement of the front/back surface of a circuit device, the recognition of positions of electrodes, and so on, can be omitted. Further, a plurality of the blocks 62 are treated simultaneously. Thus, the testing time for the circuit devices 53 can be shortened on a large scale.

Figure 11:
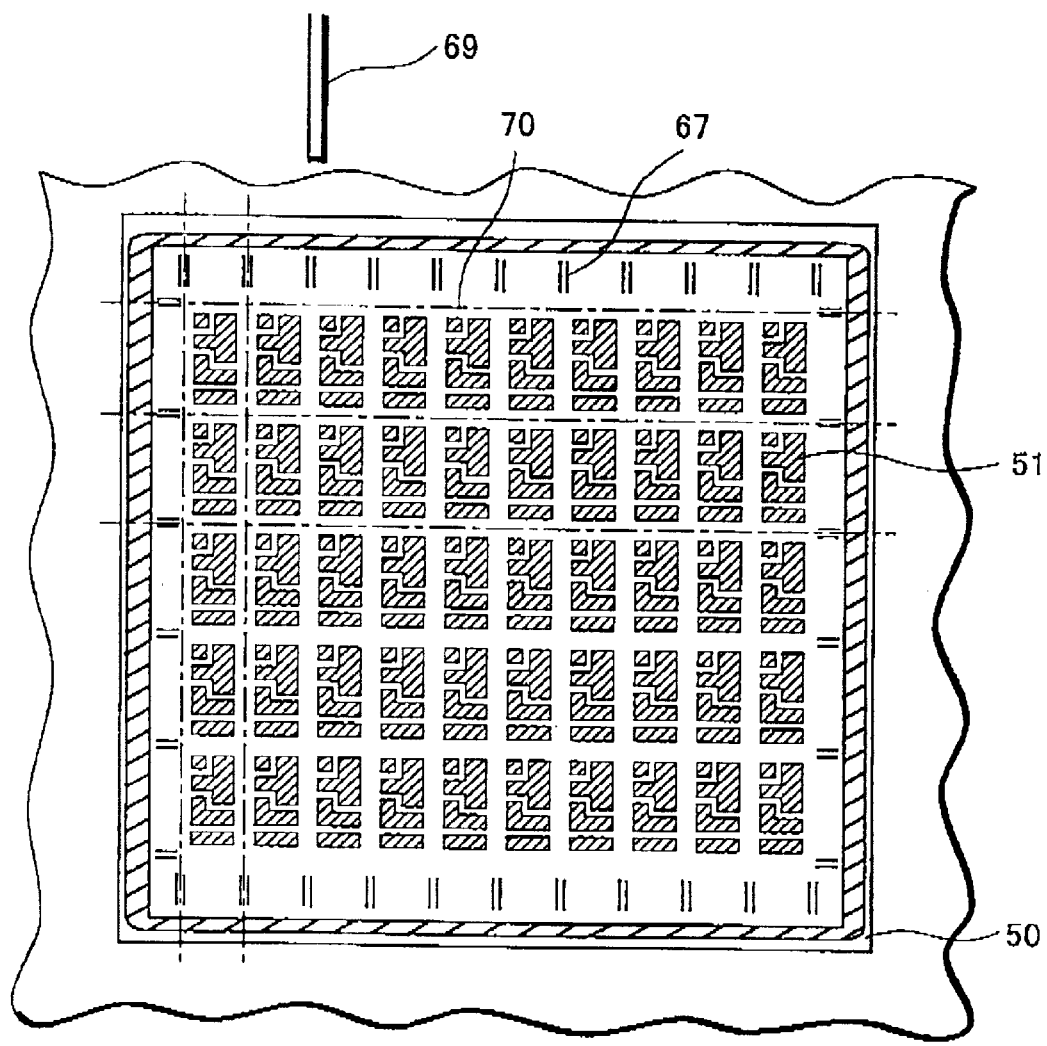
FIG. 11 is a diagram for explaining the method for manufacturing circuit devices according to the present invention.

In the eighth step of the present invention, as shown in FIG. 11, the insulating resin 50 of each block 62 is divided into the respective mounting portions 65 by dicing in the state where the block 62 is bonded with the adhesive sheet 80.

In this step, a plurality of the blocks 62 bonded to the adhesive sheet 80 are sucked onto the mounting table of a dicing apparatus in a vacuum. The insulating resin 50 in the isolation trenches 61 is diced along dicing lines 70 among the respective mounting portions 65 by a dicing blade 69. Thus, circuit devices 53 are separated individually.

In this step, the dicing blade 69 cuts the insulating resin 50 entirely so that dicing is carried out with a cutting depth reaching the surface of the adhesive sheet. Thus, the insulating resin 50 is divided entirely into pieces for each of the mounting portions 65. When dicing is to be carried out, the alignment marks 67 which are integrated with the frame-like pattern 66 in the periphery of each block and which are provided in advance in the first block described previously are first recognized. Dicing is then performed in accordance with the recognized alignment marks 67. As known well, after dicing is carried out on all the vertical dicing lines 70, the mounting table is rotated at an angle of 90°, and dicing is carried out along the horizontal dicing lines 70.

In addition, in this step, only the insulating resin 50 charged into the isolation trenches 61 exists on the dicing lines 70. Therefore, the wear rate of the dicing blade 69 is low, and no metal burrs are produced. Thus, there is a feature that extremely accurate outlines can be formed by dicing. Since burrs caused by dicing are not produced, packaging of the complete package is improved. For example, when the burrs of Cu is protruded from the back surface to the outside, the package is inclined or shorted. In addition, when dicing of the electrode made of Cu is carried out, force is applied to the electrode, thus causing a separate.

Further, even after this step, the adhesive sheet 80 prevents the circuit devices from being separated individually. Working can be done efficiently also in the following taping step. That is, the circuit devices supported integrally on the adhesive sheet 80 are determined as to whether they are good products or not. Thus, only good products can be withdrawn from the adhesive sheet 80 and received into reception holes of a carrier tape by a suction collet. Accordingly, there is a feature that even very small circuit devices are not once separated individually till they are taped.

According to the present invention, conductive foil itself serving as a material of conductive patterns is also made to function as a supporting substrate. Till isolation trenches are formed or circuit elements are mounted on the conductive foil or covered with insulating resin, the conductive patterns are wholly supported by the conductive foil. When the conductive foil is separated as respective conductive patterns, the insulating resin is made to function as a supporting substrate. Thus, circuit devices can be manufactured by the minimum requirements of the circuit elements, the conductive foil and the insulating resin. A supporting substrate which is described in the conventional example but not required by nature may be dispensed with to form circuit devices. Thus, the circuit devices can be manufactured inexpensively. In addition, because the supporting substrate is dispensed with, the conductive patterns are embedded in the insulating resin, and further, the thickness of the insulating resin and the thickness of the conductive foil can be adjusted, there is also a merit that very low-profile circuit devices can be formed.

In addition, a plurality of blocks are bonded to the adhesive sheet 80. Accordingly, very small circuit devices in a state of being not separated individually can be treated until the final step is performed. Thus, a manufacturing method having an extremely high mass productivity can be obtained.

Further, the back surface of the conductive foil is etched so that the portions where the conductive patterns are provided are selectively etched to leave connection portions between the blocks. Accordingly, the respective blocks can be withdrawn in the state where they are connected to one another through the connection portions without dropping the blocks into etchant of an etching apparatus. Thus, the working of etching is extremely easy. The method is suitable for mass production.

Further, according to the present invention, transfer-molding can be carried out for each block of the conductive foil. Thus, each block can be molded in a lump. The method is suitable for pass production. In addition, when the dimensions of the blocks are made common, a molding mold is released from the trouble in design which is required conventionally for every product.

Furthermore, there is an advantage that dicing lines can be recognized quickly and accurately in the dicing step by use of alignment marks. Further, dicing can be carried out well if only the insulating resin layer is diced. Accordingly, since the conductive toil is not cut, the life of a dicing blade can be prolonged, and metal burrs which may be produced when the conductive foil is cut are not produced at all.

In addition, a through hole forming step, a conductor printing step (in the case of a ceramic substrate), and so on, which are shown in FIGS. 14A to 14D, can be omitted. Accordingly, there is an advantage that the manufacturing process can be shortened on a large scale in comparison with the conventional case, and the complete process cycle can be internally carried out. In addition, no frame mold is required so that a method for manufacturing the circuit devices in an extremely short lead time can be realized.

What is claimed is:

1. A method for manufacturing circuit devices, comprising:

providing a plurality of conductive patterns in separate blocks on a conductive foil, said conductive patterns forming mounting portions;

disposing circuit elements on said mounting portions in each of said blocks;

commonly molding said circuit elements on said mounting portions with insulating resin to cover said circuit elements with said insulating resin in a lump in each of said blocks;

separating said blocks from each other;

adhering a plurality of said blocks onto a adhesive sheet to bring said insulating resin into contact with said adhesive sheet;

testing said circuit elements in said blocks while said blocks are attached to said adhesive sheet; and dicing said insulating resin of said blocks to separate each of said mounting portions while said blocks are attached to said adhesive sheet.

2. A method for manufacturing circuit devices according to claim 1, wherein said conductive foil is formed of material mainly including one of copper, aluminum, and iron-nickel.

3. A method for manufacturing circuit devices according to claim 1, wherein at least a part of a surface of said conductive foil is covered with a conductive film.

4. A method for manufacturing circuit devices according to claim 3, wherein said conductive film is formed by plating with one of nickel, gold and silver.

5. A method for manufacturing circuit devices according to claim 1, wherein said circuit elements include at least one of a semiconductor bare chip and a chip circuit component which are firmly fixed.

6. A method for manufacturing circuit devices according to claim 1, wherein said insulating resin is molded commonly for each of said blocks by transfer molding.

7. A method for manufacturing circuit devices according to claim 1, wherein a plurality of blocks in each of which at least conductive patterns for forming a plurality of circuit element mounting portions are aligned in a matrix are arranged on said conductive foil.

8. A method for manufacturing circuit devices according to claim 6, wherein said insulating resin is formed by transfer-molding all of said blocks on said conductive foil simultaneously.

9. A method for manufacturing circuit devices according to claim 1, wherein quality of said circuit elements on said mounting portions are tested in each of said blocks molded with said insulating resin bonded onto said adhesive sheet.

10. A method for manufacturing circuit devices according to claim 9, wherein testing is carried out while said adhesive sheet is sucked onto a mounting table in a vacuum.

11. A method for manufacturing circuit devices according to claim 1, wherein said mounting portions are separated by dicing respectively in each of said blocks molded with said insulating resin bonded to said adhesive sheet.

12. A method for manufacturing circuit devices according to claim 11, wherein a cutting depth in dicing said insulating resin is set to be not smaller than a thickness of said insulating resin, so as to separate circuit devices from one another completely.

13. A method for manufacturing circuit devices, comprising the steps of:

preparing conductive foil and forming isolation trenches, which are shallower than a thickness of said conductive foil, in said conductive foil at least excluding conductive patterns for forming circuit element mounting portions, to form said conductive patterns for each of blocks;

fixing circuit elements to desired ones of said mounting portions of said conductive patterns;

electrically connecting electrodes of said circuit elements on said mounting portions to said desired ones of said conductive patterns so as to form connection member;

commonly molding said circuit elements on said mounting portions with insulating resin so as to cover said circuit elements in a lump with said insulating resin for each of said blocks and to fill said isolation trenches with said insulating resin;

removing thick portions of said conductive foil except where said isolation trenches are provided;

separating said blocks, and bonding a plurality of said blocks onto a adhesive sheet so as to bring said insulating resin into contact with said adhesive sheet;

testing quality of said circuit elements on said mounting portions in said blocks in a state in which said blocks are bonded to said adhesive sheet; and separating said insulating resin of said blocks into said mounting portions by dicing while said blocks are bonded to said adhesive sheet.

14. A method for manufacturing circuit devices according to claim 13, wherein said conductive foil is formed of material mainly including one of copper, aluminum, and iron-nickel.

15. A method for manufacturing circuit devices according to claim 13, wherein at least a part of a surface of said conductive foil is covered with a conductive film.

16. A method for manufacturing circuit devices according to claim 15, wherein said conductive film is formed by plating with one of nickel, gold and silver.

17. A method for manufacturing circuit devices according to claim 13, wherein said isolation trenches formed selectively in said conductive foil are formed by chemical or physical etching.

18. A method for manufacturing circuit devices according to claim 13, wherein said circuit elements include at least one of a semiconductor bare chip and a chip circuit component which are firmly fixed.

19. A method for manufacturing circuit devices according to claim 13, wherein said connection member is formed by wire bonding.

20. A method for manufacturing circuit devices according to claim 13, wherein said insulating resin is molded commonly for each of said blocks by transfer molding.

21. A method for manufacturing circuit devices according to claim 13, wherein a plurality of blocks in each of which at least conductive patterns for forming a large number of circuit element mounting portions are aligned in a matrix are arranged on said conductive foil.

22. A method for manufacturing circuit devices according to claim 20, wherein said insulating resin is formed by transfer-molding all of said blocks on said conductive foil simultaneously.

23. A method for manufacturing circuit devices according to claim 13, wherein said blocks molded with said insulating resin are separated from a residual portion of said conductive foil after the step of removing said thick portions of said conductive foil except where said isolation trenches are provided.

24. A method for manufacturing circuit devices according to claim 13, wherein in the step of commonly molding said circuit elements on said mounting portions with said insulating resin, a residual portion of said conductive foil in the periphery of each of said blocks is held by molding, and said mounting portions in said block are disposed in the same cavity so as to be transfer-molded.

25. A method for manufacturing circuit devices according to claim 13, wherein in the step of removing said thick portions of said conductive foil except where said isolation trenches are provided, and in the step of separating said blocks and bonding a plurality of said blocks onto said adhesive sheet, at least areas where said conductive patterns are provided in each of said blocks of said thick portions of said conductive foil except where said isolation trenches are provided are removed, said conductive foil which will form connection portions for connecting said blocks to each other are selectively left, and said blocks are separated from said connection portions of said conductive foil.

26. A method for manufacturing circuit devices according to claim 25, wherein said blocks molded with said insulating resin are separated from said connection portions of said conductive foil by pressure applied thereto.

27. A method for manufacturing circuit devices according to claim 13, wherein quality of said circuit elements on said mounting portions are tested in each of said blocks molded with said insulating resin bonded onto said adhesive sheet.

28. A method for manufacturing circuit devices according to claim 27, wherein testing is carried out while said adhesive sheet is sucked onto a mounting table in a vacuum.

29. A method for manufacturing circuit devices according to claim 13, wherein said mounting portions are separated by dicing respectively in each of said blocks molded with said insulating resin bonded to said adhesive sheet.

30. A method for manufacturing circuit devices according to claim 29, wherein dicing is carried out by use of alignment marks formed together with said conductive pattern.

31. A method for manufacturing circuit devices according to claim 29, wherein dicing is carried out while said adhesive sheet is sucked on a mounting table in a vacuum.

32. A method for manufacturing circuit devices according to claim 29, wherein a cutting depth in dicing said insulating resin is set to be not smaller than a thickness of said insulating resin, so as to separate circuit devices from one another completely.

* * * * *